(12) United States Patent
Kim (10) Patent No.: US 7,052,990 B2
(45) Date of Patent: May 30, 2006

(54) SEALED PORES IN LOW-K MATERIAL DAMASCENE CONDUCTIVE STRUCTURES

(75) Inventor: Sun-Oo Kim, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/654,143

(22) Filed: Sep. 3, 2003

(65) Prior Publication Data
US 2005/0048765 A1    Mar. 3, 2005

(51) Int. Cl.
*H01L 21/4763*    (2006.01)
(52) U.S. Cl. .................................. 438/637; 438/672
(58) Field of Classification Search ............ 438/637, 438/638, 672, 675
See application file for complete search history.

(56) References Cited

U.S. PATENT DOCUMENTS

| 6,180,518 | B1 | | 1/2001 | Layadi et al. | |
| 6,482,733 | B1 | * | 11/2002 | Raaijmakers et al. | 438/633 |
| 6,518,166 | B1 | * | 2/2003 | Chen et al. | 438/622 |
| 6,528,409 | B1 | * | 3/2003 | Lopatin et al. | 438/618 |
| 6,585,811 | B1 | * | 7/2003 | Palmans et al. | 106/1.23 |
| 6,586,334 | B1 | * | 7/2003 | Jiang | 438/687 |
| 6,689,686 | B1 | * | 2/2004 | Guldi et al. | 438/678 |
| 2001/0051420 | A1 | | 12/2001 | Besser et al. | |
| 2002/0055256 | A1 | | 5/2002 | Jiang | |
| 2003/0001282 | A1 | | 1/2003 | Meynen et al. | |
| 2003/0143839 | A1 | | 7/2003 | Raaijmakers et al. | |

FOREIGN PATENT DOCUMENTS

| EP | 1 096 562 A2 | 5/2001 |
| JP | 2001-196455 | 7/2001 |

OTHER PUBLICATIONS

Caluwaerts, R., et al., Post Patterning Meso Porosity Creation: A Potential Solution for Pore Sealing, International Interconnect Technology Conference, Jun. 2-4, 2003, pp. 242-244, Omnipress, Madison, WI.

Mourier, T., et al., Porous low k pore sealing process study for 65 nm and below technologies, International Interconnect Technology Conference, Jun. 2-4, 2003, pp. 245-247, Omnipress, Madison, WI.

(Continued)

*Primary Examiner*—George Fourson
*Assistant Examiner*—Fernando L. Toledo
(74) *Attorney, Agent, or Firm*—Slater & Matsil, L.L.P.

(57) ABSTRACT

An oxide layer is used to seal pores in porous low-dielectric constant materials, thus preventing the migration of subsequently deposited copper materials into the porous low-dielectric constant materials in damascene processes. The oxide layer is deposited over the inner surface of at least one pore along a sidewall of the patterned low-dielectric constant material. In one embodiment, the oxide layer is deposited using atomic layer deposition (ALD), and the oxide layer comprises $SiO_2$.

20 Claims, 3 Drawing Sheets

OTHER PUBLICATIONS

Park, Jae-Eun et al., Mass-Productive Ultra-Low Temperature ALD $SiO_2$ Process Promising for Sub-90nm Memory and Logic Devices, International Electron Devices Meeting Technical Digest, Dec. 8-11, 2002, San Francisco, CA.

Hu, B.K. et al., "Spin-On Barrier for Pore-Sealing on 2.2 Porous Ultra Low-K Material", Advanced Metallization Conference (AMC) 2003, Oct. 21-23, 2003, Montreal, Canada.

Hu, B.K. et al., "Spin-On Barrier for Pore-Sealing on 2.2 Porous Ultra Low-K Material," Advanced Metallization Conference (AMC) 2003, Oct. 21-23, 2003, pp. 421-427, Montreal, Canada, Materials Research Society, Warrendale, Pennsylvania.

* cited by examiner

SEALED PORES IN LOW-K MATERIAL DAMASCENE CONDUCTIVE STRUCTURES

TECHNICAL FIELD

The present invention relates generally to semiconductor devices, and more particularly to a method and device for preventing copper migration into damascene-patterned porous low-dielectric constant material layers of a semiconductor device.

BACKGROUND

In the evolution of integrated circuits in semiconductor technology, there has been a trend towards device scaling. Scaling or reducing the size increases circuit performance, primarily by increasing circuit speed, and also increases the functional complexity of the integrated circuits. The number of devices per chip has increased throughout the years. When integrated circuits contained only a small number of devices per chip, the devices could be easily interconnected in a single level. However, the need to accommodate more devices and increased circuit speed has led to the use of multi-level or multi-layer interconnects.

In a multi-level interconnection system, the area needed by the interconnect lines is shared among two or more levels, which increases the active device fractional area, resulting in increased functional chip density. Implementing a multilevel interconnect process to a fabrication scheme increases the complexity of the manufacturing process. Typically, the active devices (e.g., the transistors, diodes, capacitors and other components) are manufactured in the lower layers of wafer processing, often referred to as the Front End Of the Line (FEOL). After the active devices are processed in the FEOL, the multilevel interconnects are usually formed in the processing timeframe often referred to as the Back End Of the Line (BEOL).

As semiconductor devices continue to shrink, various aspects of multilevel interconnect processes are being challenged. The propagation delay of integrated circuits becomes limited by the large RC time delay of interconnection lines when minimum feature size is decreased below about 1 µm, for example. Therefore, the industry is tending towards the use of different materials and processes to improve multilevel interconnect implementations.

In the past, interconnect lines were made of aluminum. Now there is a trend towards the use of copper for interconnect lines because copper has a higher conductivity than aluminum. For many years, the insulating material used to isolate conductive lines from one another was silicon dioxide. Silicon dioxide has a dielectric constant (k) of approximately 4.0 or greater, where the dielectric constant value k is based on a scale where 1.0 represents the dielectric constant of a vacuum. However, now there is a move in the industry to the use of low-dielectric constant materials (e.g., having a dielectric constant k of 3.6 or less) for insulating materials. The change in both the conductive materials and insulating materials used in multilevel interconnect schemes is proving challenging and requires a change in a number of processing parameters.

Copper is a desirable conductive line material because it has a higher conductivity than aluminum. However, the RC (resistance/capacitance) time delay of copper conductive lines can be problematic, so low-dielectric constant materials are used to reduce the capacitive coupling and reduce the RC time delay between interconnect lines. However, copper easily migrates into low-dielectric constant materials, which can cause shorting and create device failures. To prevent this, liners are typically used to prevent the migration of copper into the adjacent low-dielectric constant material.

Some low-dielectric constant materials are porous, having a plurality of pores spaced throughout the dielectric material. Such porous low-dielectric constant materials may be deposited by chemical vapor deposition (CVD), or may be spun on and cured by heating to remove the solvent. Porous low-dielectric constant materials are advantageous in that they have a dielectric constant of 3.0 or less. Examples of such porous low-dielectric constant materials include porous SiLK™ and porous silicon carbonated oxide, as examples.

Figure 1A:
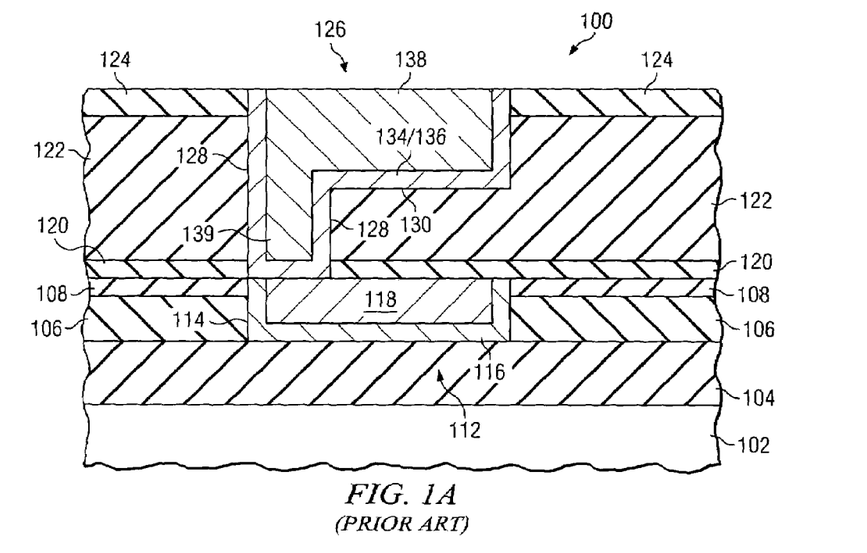
FIGS. 1A through 1D show cross-sectional views of a prior art multi-level interconnect structure, wherein copper-containing conductive material comes into direct contact with the inner surfaces of pores of the low-dielectric constant material, allowing copper migration into the low-dielectric constant material.

A prior art semiconductor device 100 is shown in FIG. 1A. A workpiece 102 is provided, wherein active components and transistors have been formed within the workpiece 102 in a FEOL process, for example. An insulating layer 104 has been formed over the workpiece 102, as shown. The insulating layer 104 may comprise borophosphosilicate glass (BPSG), as an example. A BEOL process utilizing copper and porous low-dielectric constant materials will next be described.

A first porous low-dielectric constant material 106 is deposited over the insulating layer 104, as shown. A hard mask 108 may be deposited over the first low-dielectric constant material 106. The hard mask 108 and the first low-dielectric constant material 106 are patterned with a pattern 112 for conductive lines, for example. In the example shown, the pattern 112 is a single damascene pattern for one level of metal lines. A liner 116 is deposited over the hard mask 108 and over the sidewalls 114 of the first low-dielectric constant material 106. The liner 116 also covers the top surface of the exposed insulating layer 104. The liner 116 is conductive and may comprise a first liner and a seed layer deposited over the first liner. The first liner may comprise Ta and/or TaN, and the seed layer may comprise copper. A conductive material 118 is deposited over the conductive liner 116. The conductive material 118 preferably comprises copper and may also cover the top surface of the hard mask 108.

The workpiece 102 is exposed to a chemical mechanical polish (CMP) process to remove excess conductive material 118 and excess conductive liner 116 from the top surface of the hard mask 108. Optionally, the hard mask 108 may also be removed from over the top surface of the first low-dielectric constant material 106, (not shown).

An optional cap layer 120 may be deposited over the hard mask 108 and conductive material 118 as shown. A second low-dielectric constant material 122 is then deposited over the cap layer 120. In the examples shown, the second low-dielectric constant material 122 has a greater thickness than the first low-dielectric constant material 106, because a dual damascene pattern will be formed within the second low-dielectric constant material 122.

A hard mask 124 is deposited over the second low-dielectric constant material 122. The hard mask 124 and second low-dielectric constant material 122 are then patterned with a dual damascene pattern 126. The dual damascene pattern 126 includes a narrower portion in which vias 139 will be formed, and a wider portion in which conductive lines 138 will be formed. The vias 139 connect the upper conductive lines 138 with the underlying conductive lines 118. Note that the dual damascene pattern 126 also extends through the cap layer 120 so that electrical contact may be made by the via of the dual damascene pattern 126 to the underlying conductive line 118.

A conductive liner 134/136 is then deposited over the patterned hard mask 124 and second low-dielectric constant material 122. The liner 134/136 includes a liner 134 deposited over the sidewalls 128 and horizontal surface 130 of the second low-dielectric constant material 122 and exposed top surface of the conductive lines 118. The liner 134 may comprise Ta, a bilayer of Ta and TaN, or other materials, as examples. The liner 134/136 includes a seed layer 136 comprising copper deposited over the liner 134. The liner 134/136 is also deposited on the top surface of the hard mask 124, for example, not shown.

A conductive material 138/139 comprising copper is then deposited over the seed layer 136 to fill the patterned second low-dielectric constant material 122 and other patterned areas of the cap layer 120 and hard mask 124. The workpiece 102 is then exposed to another CMP process to remove the conductive material 138/139 and liner 134/136 from the top surface of the hard mask 124 and form conductive lines 138 and vias 139 within the second low-dielectric constant material 122.

Figure 1B:
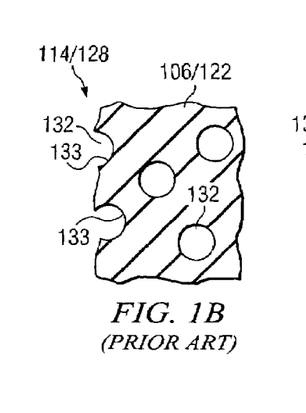

The low-dielectric constant materials 106 and 122 comprise porous materials. When these porous low-dielectric constant materials 106 and 122 are patterned, the sidewalls 114 and 128 of the low-dielectric constant materials 106 and 122, respectively, appear as shown in an exploded view in FIG. 1B. Because the pores 132 of the two low-dielectric constant material layers 106 and 122 are similar, only one exploded view is shown, for purposes of discussion. The pores 132 of the first low-dielectric constant material 106 and second low-dielectric constant material 122 are opened in the region along the sidewalls 114 and 128 and also along horizontal surface 130 of the second low-dielectric constant material 122 to expose an inner surface 133 of each pore 132 along the sidewalls 114 and 128.

Figure 1C:
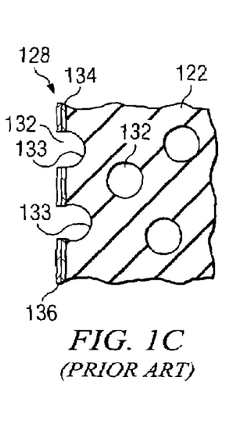
Figure 1D:
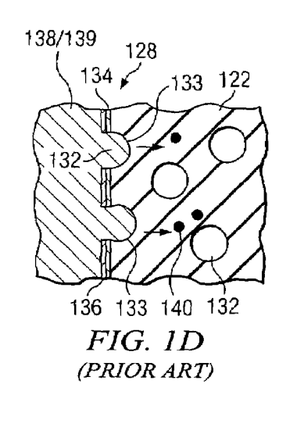

FIGS. 1C and 1D illustrate an exploded view of the deposition of the conductive liner 134/136 and conductive fill material 138/139 along the sidewall 128 of the second low-dielectric constant material 122, respectively. While these cross-sectional views will be described with respect to the pores 132 along the sidewall 128 of the second low-dielectric constant material 122, the same phenomena may be seen along the sidewall 114 of the first low-dielectric constant material 106 and along the horizontal surface 130 of the second low-dielectric constant material 122.

In this prior art process, when the liner 134 is deposited within the patterned second low-dielectric constant material 122, the liner 134 has poor step coverage and does not completely fill the pores 132 along the sidewall 128 that have been opened. Rather, as shown in FIG. 1C, the inner surfaces 133 of the pores 132 along the sidewall 128 remain unlined and unfilled. When the seed layer 136 is subsequently deposited over the liner 134, again, the seed layer 136 is not deposited on the inner surface 133 of the pores 132, and the pores 132 remain unlined along the inner surface 133.

FIG. 1D illustrates a cross-sectional view of a close-up of the sidewall 128 after the conductive material 138/139 comprising copper has been deposited within the patterned second conductive layer 122. The conductive material 138/139 fills the pores 132 along the sidewall 128 that has not been lined by the seed layer 136 and liner 134. The conductive material 138/139 makes direct contact with the inner surface 133 of the pores 132 along the sidewall 128. Because copper 140 from the conductive material 138/139 migrates or diffuses very quickly within the dielectric material 122, fast diffusion paths are created for the copper-containing conductive material 138/139 into the second low-dielectric constant material 122. The copper diffusion channel that is created within porous low-dielectric constant materials 122 and 106 causes reliability problems in semiconductor devices 100, causing shorts and devise failures.

FIGS. 2A through 2D illustrate a prior art method of attempting to prevent copper from migrating into porous low-dielectric constant materials through pores along the sidewalls of patterned porous low-dielectric constant materials. The same structure having a single damascene layer and a dual damascene layer is shown in FIGS. 1A through 1D as is shown in FIGS. 2A through 2D. Like numerals are used in FIGS. 2A through 2D with respect to FIGS. 1A through 1D to describe the various elements and common components shown.

Figure 2A:
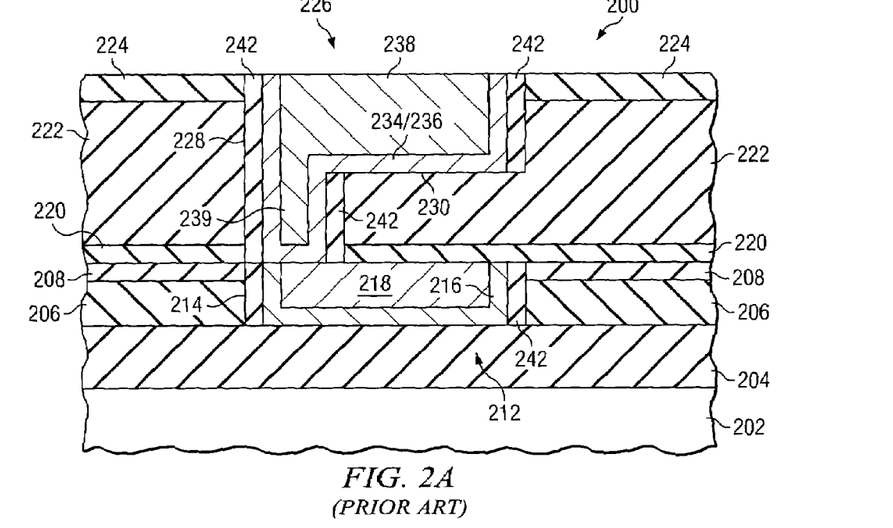
FIGS. 2A through 2D show a prior art method of forming an oxide spacer along the sidewalls of dielectric materials prior to the deposition of conductive material, which fails to prevent copper migration into the porous low-dielectric constant material.
Figure 2B:
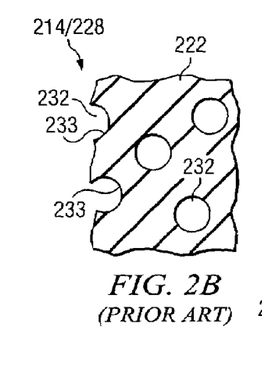
Figure 2C:
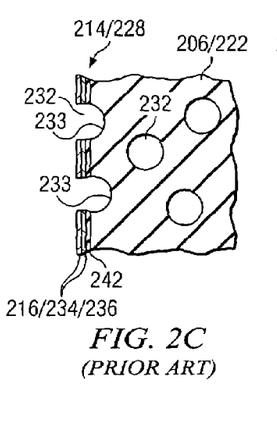
Figure 2D:
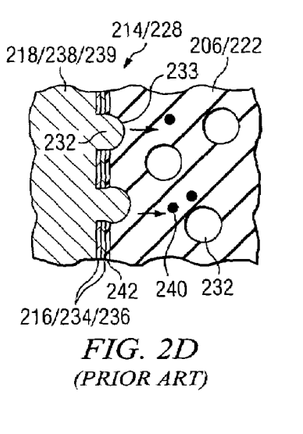

Referring first to FIGS. 2A and 2B, in this prior art process, a plasma enhanced chemical vapor deposition (PECVD) oxide spacer 242 is formed along the sidewalls 214 and 228 of the low-dielectric constant materials 206 and 228 prior to filling the damascene patterns with a conductive liner and conductive material. However, as shown in FIGS. 2C and 2D, the PECVD oxide spacer 242 has poor step coverage of the pores 232, and does not line the inner surface 233 of the pores 232 that are exposed on the sidewalls 214/228. Therefore, the inner surface 233 of the pores 232 are not protected from the copper of the subsequently deposited conductive material 218 and 238/239, as shown in FIG. 2D, and a path of diffusion is created for the copper 240 within the conductive material 218 and 238/239. Copper 240 thus diffuses into the pores 232 of the porous low-dielectric constant materials 206 and 222, causing reliability problems, shorts, and device failures.

Therefore, what is needed in the art is a method and structure for preventing copper migration and diffusion into porous low-dielectric constant materials of semiconductor devices.

SUMMARY OF THE INVENTION

These and other problems are generally solved or circumvented, and technical advantages are generally achieved, by preferred embodiments of the present invention, which provide a method and structure for lining the inner surface of pores of porous low-dielectric constant materials on sidewalls of patterned damascene structures, preventing copper migration.

In accordance with a preferred embodiment of the present invention, a method of manufacturing a semiconductor device includes providing a workpiece and depositing a low-dielectric constant material over the workpiece, the low-dielectric constant material comprising a plurality of pores, each pore having an inner surface. A portion of the low-dielectric constant material is removed to form a pattern in the low-dielectric constant material, exposing the inner surface of at least one pore along a sidewall of the patterned low-dielectric constant material. An oxide layer is deposited over the low-dielectric constant material sidewalls and the inner surface of the exposed at least one pore. A conductive material is deposited within the patterned low-dielectric constant material.

In accordance with another preferred embodiment of the present invention, a semiconductor device includes a workpiece and a low-dielectric constant material disposed over the workpiece. The low-dielectric constant material includes a plurality of pores, each pore having an inner surface, wherein a pattern is formed in the low-dielectric constant material, and wherein at least one pore on a sidewall of the patterned low-dielectric constant material is open to expose the inner surface of the pore. An oxide layer is disposed over the patterned low-dielectric constant material sidewalls and the inner surface of the open at least one pore. A conductive material is disposed within the patterned low-dielectric constant material.

Advantages of preferred embodiments of the present invention include providing a method of sealing sidewalls and surfaces of damascene structures with an oxide, wherein the inner surfaces of the pores of a porous low-dielectric constant material are fully lined to prevent copper migration into the low-dielectric constant material. Reliability of semiconductor devices is improved, and device yields are increased. Device failures are also prevented.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device and the BEOL of the fabrication process. The invention may also be applied to conductive layers formed in an FEOL, for example.

Figure 3A:
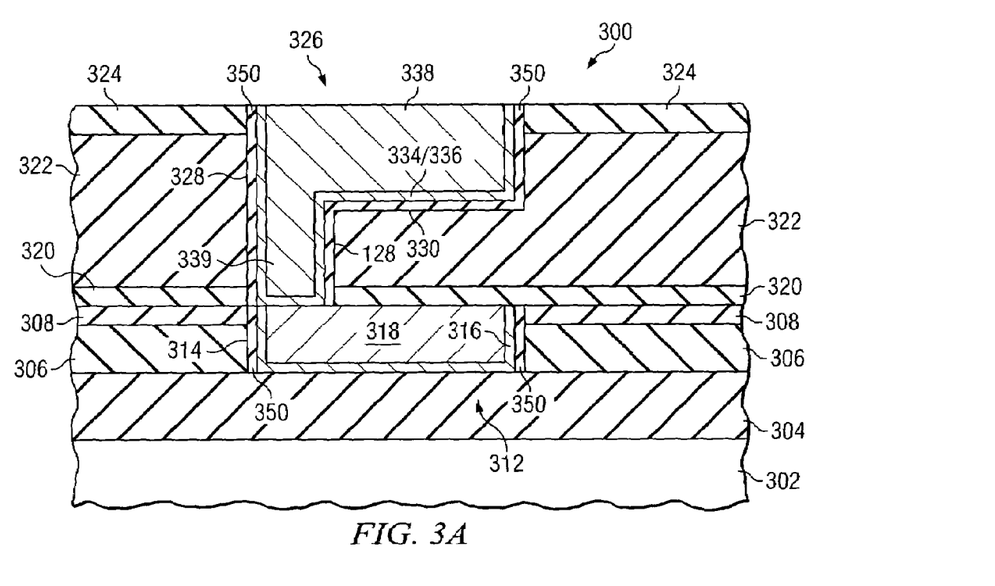
FIGS. 3A through 3D illustrate cross-sectional views of a preferred embodiment of the present invention, wherein the interior surface of the pores of the low-dielectric constant material are completely lined with an oxide layer, preventing copper migration.

With reference now to FIG. 3A, therein is shown a cross-sectional view of a semiconductor device 300 having a multi-level interconnect structure formed in accordance with a preferred embodiment of the present invention. A workpiece 302 is provided. The workpiece 302 may include a semiconductor substrate comprising silicon or other semiconductor materials covered by an insulating layer, for example. The workpiece 302 may also include other active components or circuits formed in the front end of line (FEOL), not shown. The workpiece 302 may comprise silicon oxide over single-crystal silicon, for example. The workpiece 302 may include other conductive layers or other semiconductor elements, e.g. transistors, diodes, etc. Compound semiconductors, GaAs, InP, Si/Ge, or SiC, as examples, may be used in place of silicon.

An insulating layer 304 is formed over the workpiece 302. The insulating layer 304 preferably comprises BPSG and may alternatively comprise other insulating materials, for example. A first porous low-dielectric constant material 306 is deposited over the insulating material 304. The low-dielectric constant material 306 may comprise 200 Angstroms or less of porous SiLK™ or porous silicon carbonated oxide, as examples. Alternatively, the low-dielectric constant material 306 may comprise other porous low-dielectric constant materials, and may be deposited in other thicknesses.

A hard mask 308 is deposited over the first low-dielectric constant material 306. The hard mask 308 may comprise SiC, SiCN, $SiO_2$, or SiN, as examples. Alternatively, the hard mask 308 may comprise other insulating materials. The hard mask 308 is advantageous in that it serves as an etch stop for the subsequent CMP process to remove excess conductive material from the top surface of the wafer, although the hard mask 308 is optional.

The first low-dielectric constant material 306 is patterned using traditional lithography techniques to form a pattern 312 for conductive lines. In the example shown, for example, the pattern 312 comprises a single damascene pattern for a conductive line within the first low-dielectric constant material 306. Alternatively, the first low-dielectric constant material 306 may be patterned with a dual damascene pattern, not shown. Note that the hard mask 308 is also patterned with the damascene pattern 312.

Figure 3B:
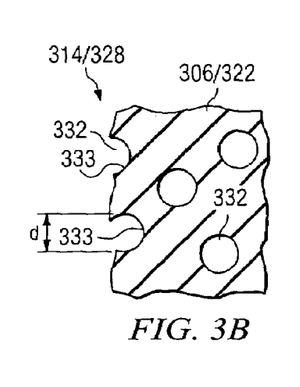

Another cross-sectional view of the semiconductor device 300 is shown in FIG. 3B. A close-up of the sidewall 314 (and also sidewall 328, to be discussed further herein) is shown, wherein some of the pores 332 along the sidewall 314 have been opened during the patterning process to expose the inner surface 333 of the pores 332. The pores 332 may have a diameter d of 10 nm or greater, for example. Note that the pores 332 may be opened anywhere along their surface, for example, in the middle of the pore 332 or more towards an edge of the pore 332.

Figure 3C:
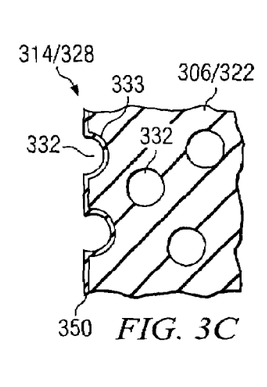

In accordance with an embodiment of the present invention, after the low-dielectric constant material 306 is patterned, an oxide layer 350 is formed on the sidewall 314 of the low-dielectric constant material 306, as shown in FIG. 3C. Preferably, the oxide layer 350 completely lines not only the sidewalls 314 of the low-dielectric constant material 306, but also the inner surface 333 of each pore 332 along the sidewalls 314. The oxide layer 350 is preferably formed by atomic layer deposition (ALD) in one embodiment. The oxide layer 350 preferably comprises SiO$_2$ and may comprise a thickness of 20 Angstroms to 200 Angstroms, for example. Alternatively, the oxide layer 350 may comprise a thickness of 200 Angstroms or less. The oxide layer 350 is preferably deposited at low temperature, suitable for BEOL processing, e.g., at about 450 degrees C. or less. More preferably, the oxide layer 350 is deposited at a temperature of about 100 to 250 degrees C. for a time period of about 30 minutes, for example.

The oxide layer 350 may line the inner surface 333 of the pore 332 such that a recess still remains in the sidewall 328. Alternatively, the oxide layer 350 may completely fill the pore 332, for example (not shown). Preferably, the deposition process for oxide layer 350 has good step coverage such that there is no region of the low-dielectric constant material 306 that is not covered by the oxide layer 350, preventing copper migration into the low-dielectric constant material 306.

Figure 4:
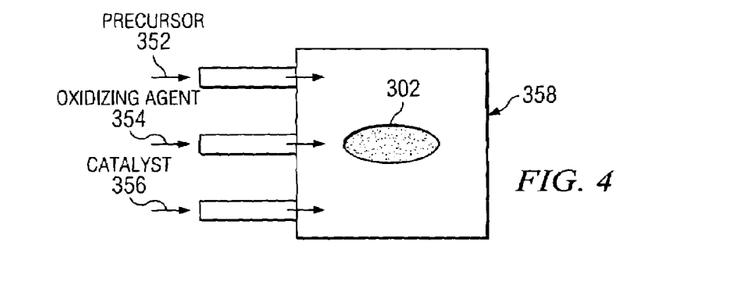
FIG. 4 shows a schematic diagram of a chamber in which a semiconductor device may be processed in accordance with embodiments of the present invention.

In another embodiment, the oxide layer 350 is formed by exposing the workpiece 302 to a precursor 352 and an oxidizing agent 354, as shown in FIG. 4. An optional catalyst 356 may be introduced into the chamber while the workpiece 302 is heated. The precursor 352 may comprise SiH$_4$, SiCl$_4$, or Si$_2$Cl$_6$, as examples. Alternatively, the precursor 352 may comprise other materials, as examples. The oxidizing agent 354 preferably comprises H$_2$O, H$_2$O$_2$, diluted H$_2$O$_2$, N$_2$O, or combinations thereof, as examples. The oxidizing agent 354 may be decomposed into its products under the direct or remote plasma catalyst 356 to enhance and control the oxide layer 350 deposition, in one embodiment. The workpiece 302 may be heated to a temperature of about 450° C. or less during the deposition of the oxide layer 350, for example. If the optional catalyst 356 is used, the catalyst 356 preferably comprises pyridine, for example.

Referring again to FIG. 3A, the workpiece 302 is then processed in accordance with prior art techniques to fill the patterned low-dielectric constant material 306 with conductive material and form conductive lines 318. For example, a liner 316 is deposited over the oxide layer 350, and a conductive material 318 comprising copper is deposited over the liner 316. The liner 316 may comprise a first conductive liner and a seed layer, as described with reference to FIGS. 1A through 1D. The workpiece 302 is then exposed to a CMP process to remove the conductive layer 318 and liner 316 from the top surface of the hard mask 308, or if a hard mask 308 is not used, from over the top surface of the porous low-dielectric constant material 306. Advantageously, the conductive material 318 is prevented from directly abutting the oxide layer 350 by the oxide layer 350. Rather, the conductive material 318 is adjacent the seed layer/liner 316, which directly abuts the oxide layer 350, so that the conductive material 318 does not make direct contact with the low-dielectric constant material 306, so that there are no paths for copper diffusion into the low-dielectric constant material 306.

An optional cap layer 320 may be deposited over the hard mask 308 and conductive material 318, as shown in FIG. 3A. The cap layer 320 may comprise SiN, SiC, or silicon carbon doped with nitrogen, or other materials, as examples. The cap layer 320 prevents outdiffusion of the copper from conductive material 318 into the overlying low-dielectric constant material 322 that will next be deposited.

The process may also be used to prevent copper migration in a dual damascene pattern 326, as shown in a subsequently deposited second low-dielectric constant material layer 322. The second low-dielectric constant material 322 may comprise a thickness of 1500 to 4500 Angstroms, for example, although the second low-dielectric constant material layer 322 may alternatively comprise other thicknesses. A hard mask 324 may be deposited over the second low-dielectric constant material 322, as shown. The hard mask 324 may comprise similar materials and thicknesses as described for hard mask 308, for example. The optional hard mask 324 and second low-dielectric constant material 322 are patterned with the dual damascene pattern 326. For example, the pattern for narrower vias 339 may first be patterned, followed by a subsequent pattern of the wider conductive line 338 regions. Alternatively, first the wider conductive lines 338 may be patterned, followed by the patterning of the narrower vias 339.

Figure 3D:
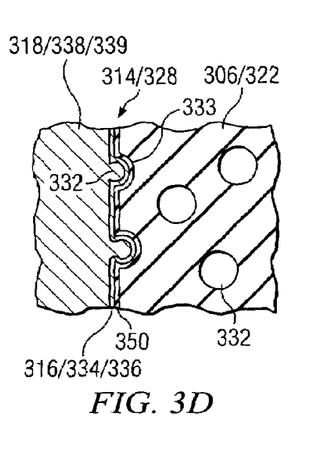

In accordance with an embodiment of the present invention, an oxide layer 350 is then formed over the patterned low-dielectric constant material 322. The oxide layer 350 again preferably comprises ALD SiO$_2$, which completely lines not only the sidewalls 328 and horizontal surfaces 330 of the patterned low-dielectric constant material 322 but also lines the inner surface 333 of each pore 332 along the sidewall 328 that has been opened during the patterning process of the low-dielectric constant material 322, as shown in FIG. 3C. This is advantageous in that when the conductive liner 334, seed layer 336, and conductive material 338/339 are subsequently deposited, as shown in FIG. 3D, the oxide layer 350 on the inner surface 333 of the pores 332 prevents copper in the conductive material 338/339 and liner 334/336 from migrating or diffusing into the second low-dielectric constant material 322, thus preventing the formation of shorts and other reliability issues.

An optional cap layer may be deposited over the hard mask 324 and conductive material 318 (not shown). The cap layer may comprise similar materials and thicknesses as described for cap layer 320, for example. The cap layer prevents outdiffusion of the copper from subsequently deposited low-dielectric constant materials, also not shown. A multi-level interconnect structure having improved reliability and no copper migration may be manufactured by depositing, patterning and processing a plurality of low-dielectric constant material layers, using the manufacturing process described herein.

FIG. 4 illustrates a schematic diagram of a chamber 358 in which the ALD SiO$_2$ oxide layer 350 may be formed over the low-dielectric constant materials 306 and 322 described herein. The workpiece 302 having the patterned low-dielectric constant materials 306 or 322 is placed within the chamber 358. The precursor 352, oxidizing agent 354, and catalyst 356 are introduced into the chamber 358 through pipes, as shown. The chamber 358 is then heated to the desired temperature, which is preferably less than about 450° C., which may comprise a maximum processing temperature for the BEOL, for example. The workpiece 302 may be heated at 100 to 450° C. for 30 minutes or less, as an example.

The oxide layer 350 has been described herein as preferably being formed using ALD. However, alternatively, the oxide layer 350 may be formed by depositing silicon dioxide in the presence of a hydrocarbon or a dopant such as F or B, as examples.

While the pores of the low-dielectric constant materials described herein comprise a diameter d of 10 nm or greater, advantages of embodiments of the present invention are particularly seen in low-dielectric constant materials having pores of a size of 10–20 nm or greater, for example.

The hard masks 308 and 324 described herein are optional and may be omitted entirely, or may be removed after the CMP processes described herein to remove excess conductive material 318 and 338/339 from the top surface of the low-dielectric constant materials 306 and 322.

Embodiments of the present invention include methods of forming an oxide layer 350 over damascene-patterned low-dielectric constant material layers 306 and 322 for a semiconductor device 300. Embodiments of the present invention also include a semiconductor device 300 having a workpiece 302 and a low-dielectric constant material 306 and/or 322 disposed over the workpiece 302. The low-dielectric constant material 306 and/or 322 includes a plurality of pores 332, with each pore 332 having an inner surface 333. A pattern is formed in the low-dielectric constant material 306 and/or 322, wherein at least one pore 332 on a sidewall 314/328 or 330 of the patterned low-dielectric constant material 306 and/or 322 is opened to expose the inner surface 333 of the pore 332. The semiconductor device 300 includes an oxide layer 350 disposed over the patterned low-dielectric constant material sidewalls and the inner surface 333 of the open at least one pore 332. A conductive material 318 or 338/339 is disposed within the low-dielectric constant material 306 or 322.

Advantages of embodiments of the invention include providing a method of forming a multi-level semiconductor device 300 wherein an oxide layer 350 is deposited over the inner surfaces 333 of pores 332 along sidewalls 314 and 328 and horizontal surfaces 330 of porous low-dielectric constant material 306 or 322 in order to prevent copper from migrating and diffusing into the low-dielectric constant material 306 or 322. This results in improved reliability of the semiconductor device 300, decreased numbers of device 300 failures, and improved yields.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device resistant to conductive metal migration, the method comprising:
    providing a workpiece;
    depositing a low-dielectric constant material over the workpiece, the low-dielectric constant material comprising a plurality of pores, each pore having an inner surface;
    removing a portion of the low-dielectric constant material to form a pattern in the low-dielectric constant material, exposing the inner surface of at least one pore having a diameter of between about 10 nm and 20 nm along a sidewall of the patterned low-dielectric constant material;
    atomic layer depositing an oxide layer having a thickness of between about 20 Å and 200 Å over the low-dielectric constant material sidewalls, the oxide layer lining but not filling the inner surface of the exposed at least one pore; and
    depositing a conductive metal within the patterned low-dielectric constant material including within the inner surface of the exposed at least one pore.

2. The method according to claim 1, wherein depositing the oxide layer comprises depositing $SiO_2$.

3. The method according to claim 2, wherein depositing the oxide layer comprises:
    exposing the workpiece to a precursor and an oxidizing agent, and
    heating the workpiece between 100° C. and 250° C.

4. The method according to claim 3, wherein exposing the workpiece to the precursor comprises exposing the workpiece to $SiH_4$, $SiCl_4$, or $Si_2Cl_6$.

5. The method according to claim 3, wherein exposing the workpiece to the oxidizing agent comprises exposing the workpiece to $H_2O$, $H_2O_2$, diluted $H_2O_2$, $N_2O$, or combinations thereof.

6. The method according to claim 1, wherein atomic layer depositing an oxide layer comprises heating the workpiece to a temperature of about 450 degrees C. or less.

7. The method according to claim 3, further comprising exposing the workpiece to a catalyst.

8. The method according to claim 7, wherein the catalyst comprises pyridine.

9. The method according to claim 1, wherein depositing the oxide layer comprises depositing silicon dioxide and a hydrocarbon or a dopant.

10. The method according to claim 1, wherein depositing the conductive material comprises:
    depositing a liner over the oxide layer;
    depositing a seed layer over the liner; and
    depositing a copper-containing material over the seed layer to fill the patterned low-dielectric constant material.

11. The method according to claim 10, wherein depositing the liner comprises depositing a bi-layer of Ta and TaN, wherein depositing the seed layer comprises depositing Cu, and wherein depositing the copper-containing material comprises an electroplating process.

12. The method according to claim 1, wherein removing the portion of the low-dielectric constant material comprises forming a dual damascene pattern, wherein depositing the conductive material comprises forming both vias and conductive lines within the patterned low-dielectric constant material.

13. A method of manufacturing a semiconductor device resistant to conductive metal migration, the method comprising:
    forming a plurality of active components in a semiconductor body;
    forming a porous dielectric layer over the semiconductor body;
    forming a recess in the porous dielectric layer and exposing the inner surface of at least one pore having a diameter of between about 10 nm to 20 nm;
    atomic layer deposition (ALD) an oxide layer having a thickness of between 20 Å to 200 Å step to form a dielectric liner along sidewalls of the recess in the porous dielectric layer including the inner surface of said at least one pore, said oxide layer lining but not filling the inner surface of said at least one pore;

forming a conductive liner overlying the thin dielectric layer within the recess; and depositing a copper conductor over the conductive liner and filling the recess including inner surface of said at least one pore.

14. The method according to claim 13, wherein depositing the oxide layer comprises:

exposing the workpiece to a precursor and an oxidizing agent, and heating the workpiece.

15. The method according to claim 14, wherein exposing the workpiece to the precursor comprises exposing the workpiece to $SiH_4$, $SiCl_4$, or $Si_2Cl_6$.

16. The method according to claim 14, wherein exposing the workpiece to the oxidizing agent comprises exposing the workpiece to $H_2O$, $H_2O_2$, diluted $H_2O_2$, $N_2O$, or combinations thereof.

17. The method according to claim 14, further comprising exposing the workpiece to a catalyst.

18. The method according to claim 17, wherein the catalyst comprises pyridine.

19. The method according to claim 13, wherein depositing the oxide layer comprises depositing silicon dioxide and a hydrocarbon or a dopant.

20. A method of manufacturing a semiconductor device, the method comprising:

providing a workpiece;

depositing a low-dielectric constant material over the workpiece, the low-dielectric constant material comprising a plurality of pores, each pore having an inner surface;

removing a portion of the low-dielectric constant material to form a pattern m the low-dielectric constant material, exposing the inner surface of at least one pore along a sidewall of the patterned low-dielectric constant material;

exposing the workpiece to a precursor and an oxidizing agent;

heating the workpiece to between about 100° C. and 250° C.;

atomic layer depositing a layer of $SiO_2$ over the low-dielectric constant material sidewalls and the inner surface of the exposed at least one pore said oxide layer lining but not filling the inner surface of said at least one pore; and depositing a conductive metal within the patterned low-dielectric constant material including within the inner surface of the exposed at least one pore.

* * * * *

UNITED STATES PATENT AND TRADEMARK OFFICE
CERTIFICATE OF CORRECTION

PATENT NO. : 7,052,990 B2  
APPLICATION NO. : 10/654143  
DATED : May 30, 2006  
INVENTOR(S) : Kim

Page 1 of 1

It is certified that error appears in the above-identified patent and that said Letters Patent is hereby corrected as shown below:

Column 12, line 9; delete "pattern m the" insert --pattern in the--  
Column 12, line 19; delete "pore said" insert --pore, said--

Signed and Sealed this

Twenty-eighth Day of November, 2006

JON W. DUDAS  
*Director of the United States Patent and Trademark Office*